United States Patent
Obara et al.

(10) Patent No.: US 9,723,718 B2
(45) Date of Patent: Aug. 1, 2017

(54) ELECTRONIC COMPONENT MOUNTING DEVICE AND SEMICONDUCTOR DEVICE INCLUDING THE SAME

(71) Applicant: Mitsubishi Electric Corporation, Tokyo (JP)

(72) Inventors: Taichi Obara, Tokyo (JP); Rei Yoneyama, Tokyo (JP); Takami Otsuki, Tokyo (JP); Eiju Shitama, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 189 days.

(21) Appl. No.: 14/452,785

(22) Filed: Aug. 6, 2014

(65) Prior Publication Data

US 2015/0163916 A1 Jun. 11, 2015

(30) Foreign Application Priority Data

Dec. 9, 2013 (JP) ................................ 2013-253978

(51) Int. Cl.
*H05K 1/18* (2006.01)
*H05K 1/11* (2006.01)
(Continued)

(52) U.S. Cl.
CPC ............. *H05K 1/183* (2013.01); *H01L 23/15* (2013.01); *H01L 23/49838* (2013.01);
(Continued)

(58) Field of Classification Search
CPC ..... H05K 2201/10; H05K 2201/10674; H05K 2201/10689; H05K 1/111; H05K 1/186; H05K 1/188
(Continued)

(56) References Cited

U.S. PATENT DOCUMENTS 5,606,198 A * 2/1997 Ono .................. H01L 23/53223
257/666
5,994,648 A * 11/1999 Glovatsky .............. H05K 1/183
174/254

(Continued)

FOREIGN PATENT DOCUMENTS

CN 1577187 A 2/2005
JP S59-091769 U 6/1984
(Continued)

OTHER PUBLICATIONS

An Office Action; "Notification of Reason(s) for Refusal," issued by the Japanese Patent Office on Nov. 1, 2016, which corresponds to Japanese Patent Application No. 2013-253978 and is related to U.S. Appl. No. 14/452,785; with English language partial translation.

(Continued)

*Primary Examiner* — Binh Tran
(74) *Attorney, Agent, or Firm* — Studebaker & Brackett PC

(57) ABSTRACT

An electronic component mounting device includes an insulating substrate having a metal pattern formed thereon and a MELF electronic component. The MELF electronic component is fitted into a first receiving portion configured with the metal pattern and the insulating substrate exposed from a lacking portion of the metal pattern. The electronic component mounting device further includes a conductive member formed between the MELF electronic component and the metal pattern, and the conductive member is not formed between the MELF electronic component and the insulating substrate.

12 Claims, 8 Drawing Sheets

(51) Int. Cl.
- *H01L 23/15* (2006.01)
- *H05K 3/34* (2006.01)
- *H05K 7/12* (2006.01)
- *H05K 7/00* (2006.01)
- *H01L 23/13* (2006.01)
- *H01L 23/373* (2006.01)
- *H01L 23/498* (2006.01)

(52) U.S. Cl.
CPC ............... *H05K 1/11* (2013.01); *H05K 1/111* (2013.01); *H05K 3/3442* (2013.01); *H01L 23/13* (2013.01); *H01L 23/3735* (2013.01); *H01L 23/49827* (2013.01); *H01L 23/49844* (2013.01); *H01L 2224/32225* (2013.01); *H01L 2924/19105* (2013.01); *H05K 1/186* (2013.01); *H05K 1/188* (2013.01); *H05K 2201/09072* (2013.01); *H05K 2201/09745* (2013.01); *H05K 2201/10* (2013.01); *H05K 2201/1059* (2013.01); *H05K 2201/10174* (2013.01); *H05K 2201/10636* (2013.01); *H05K 2201/10651* (2013.01); *H05K 2201/10674* (2013.01); *H05K 2201/10689* (2013.01); *Y02P 70/611* (2015.11); *Y02P 70/613* (2015.11)

(58) Field of Classification Search
USPC ....... 361/760, 761, 763, 764, 767, 777, 782, 361/783
See application file for complete search history.

(56) References Cited

U.S. PATENT DOCUMENTS

| | | | |
|---|---|---|---|
| 7,046,200 B2 | 5/2006 | Furuya | |
| 7,876,577 B2* | 1/2011 | Weber | H05K 1/183 174/260 |
| 8,227,700 B2* | 7/2012 | Kim | H01L 25/0655 174/255 |
| 9,443,784 B2 | 9/2016 | Hatori | |
| 2005/0007281 A1 | 1/2005 | Furuya | |
| 2009/0308641 A1 | 12/2009 | Kim | |
| 2013/0249100 A1* | 9/2013 | Morishita | H01L 23/13 257/772 |
| 2015/0084179 A1 | 3/2015 | Hatori | |

FOREIGN PATENT DOCUMENTS

| | | |
|---|---|---|
| JP | S61-174795 A | 8/1986 |
| JP | H02-148884 A | 6/1990 |
| JP | H03-000062 U | 1/1991 |
| JP | H03-280591 A | 12/1991 |
| JP | H09-008441 A | 1/1997 |
| JP | 2002-198638 A | 7/2002 |
| JP | 2006-032511 A | 2/2006 |
| WO | 2013/132644 A1 | 9/2013 |

OTHER PUBLICATIONS

The First Office Action issued by the Chinese Patent Office on Apr. 1, 2017, which corresponds to Chinese Patent Application No. 201410747912.5 and is related to U.S. Appl. No. 14/452,785; with English language translation.

An Office Action; "Notification of Reason(s) for Refusal," issued by the Japanses Patent Office on Jun. 13, 2017, which corresponds to Japanese Patent Application No. 2013-253978 and is related to U.S. Appl. No. 14/452,785; with English language translation.

* cited by examiner

SECTION A1-A1

SECTION A2-A2

SECTION B2-B2

SECTION A3-A3

SECTION A4-A4

SECTION B4-B4

SECTION A5-A5

ELECTRONIC COMPONENT MOUNTING DEVICE AND SEMICONDUCTOR DEVICE INCLUDING THE SAME

BACKGROUND OF THE INVENTION

Field of the Invention

The present invention relates to an electronic component mounting device having a MELF electronic component mounted on an insulating substrate and to a semiconductor device including the electronic component mounting device.

Description of the Background Art

The variety of techniques for suppressing a positional displacement upon mounting of a MELF electronic component on a mounting substrate has been developed. For example, the technique disclosed in Japanese Patent Application Laid-Open No. 2006-32511 forms the U-shaped (square U-shaped) conductive electrode having the inner dimensions greater than the diameter of the MELF electronic component, whereby the above-mentioned positional displacement can be suppressed.

In general, activating an electronic component, a semiconductor element, or the like mounted on a mounting substrate generates heat which will be conducted to the mounting substrate, and then the thermal stress causing the warpage of the mounting substrate is generated in the mounting substrate. However, the technique in Japanese Patent Application Laid-Open No. 2006-32511 provides the conductive member such as a solder under the MELF electronic component, so that the MELF electronic component and the mounting substrate are strongly bonded to each other. Thus, while the thermal stress of the mounting substrate remains relatively high, the thermal stress is applied to the MELF electronic component, resulting in adverse effects on the MELF electronic component in some cases.

In a particular case where a ceramic substrate is used for the mounting substrate and an electric power semiconductor element (a power semiconductor element) such as a power switching element having a relatively high heating value is mounted on the ceramic substrate, the greater thermal stress is conceivably applied to the MELF electronic component.

SUMMARY OF THE INVENTION

The present invention has been made in view of the above-mentioned problems, and an object thereof is to provide the technique capable of suppressing the positional displacement of the MELF electronic component and reducing the thermal stress applied to the MELF electronic component.

An electronic component mounting device of the present invention includes an insulating substrate having a metal pattern formed thereon and the MELF electronic component. The MELF electronic component is fitted into a first receiving portion configured with the metal pattern and the insulating substrate exposed from a lacking portion of the metal pattern or fitted into a second receiving portion configured with recessions formed in upper portions of side portions facing each other of the metal pattern divided by a lacking portion of the metal pattern. The electronic component mounting device further includes a conductive member formed between the MELF electronic component and the metal pattern, and the conductive member is not formed between the MELF electronic component and the insulating substrate.

The MELF electronic component is fitted into the first receiving portion or the second receiving portion, to thereby suppress the positional displacement between the insulating substrate and the MELF electronic component. The thermal stress applied to the MELF electronic component from the insulating substrate can also be reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
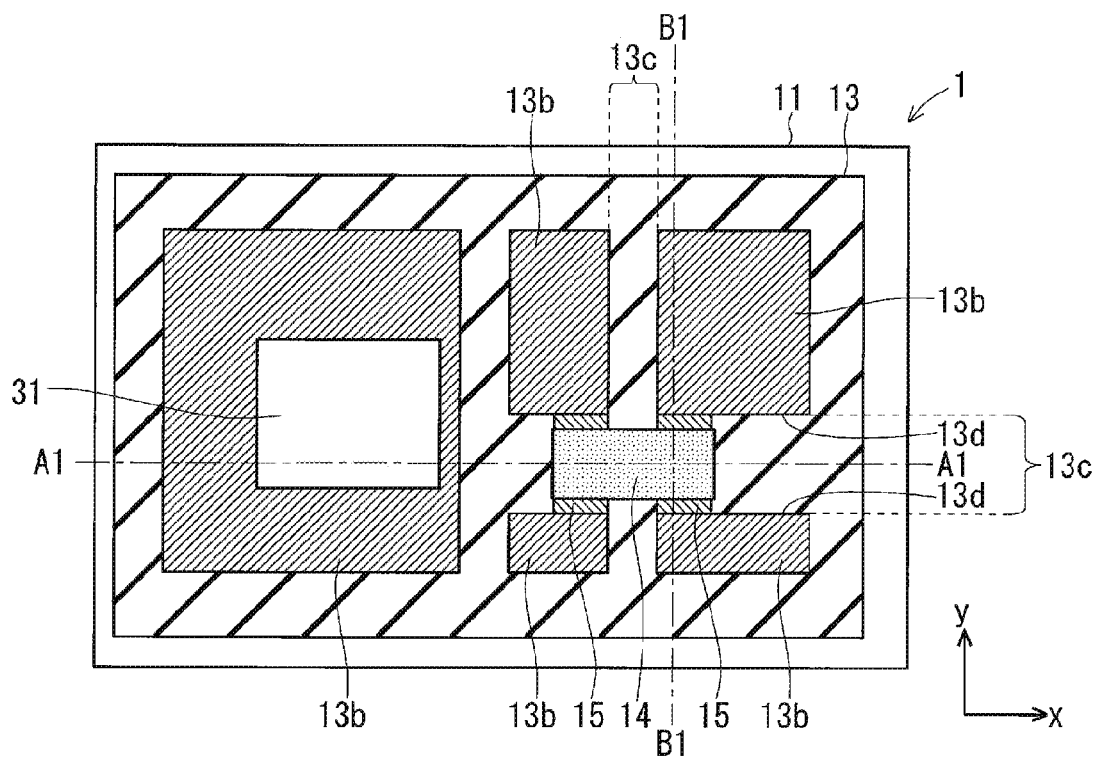
FIG. 1 is a top view showing a configuration of a semiconductor device according to a first preferred embodiment.
Figure 2:
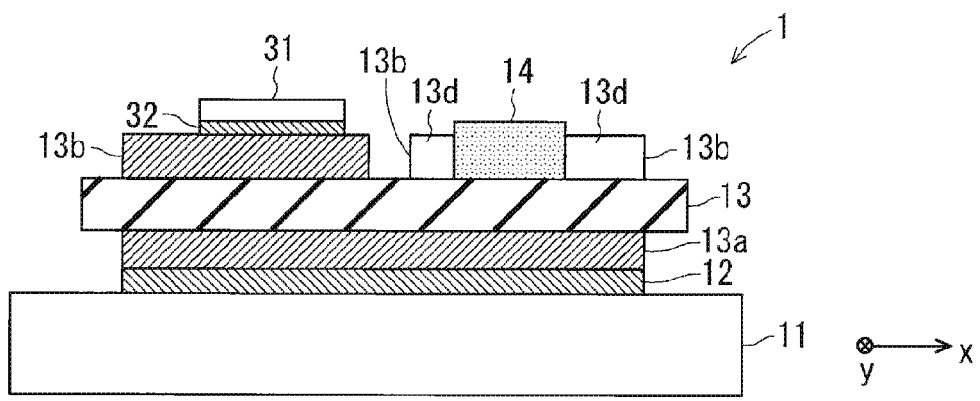
FIG. 2 is a cross-sectional view taken along an A1-A1 line showing the configuration of the semiconductor device according to the first preferred embodiment.
Figure 3:
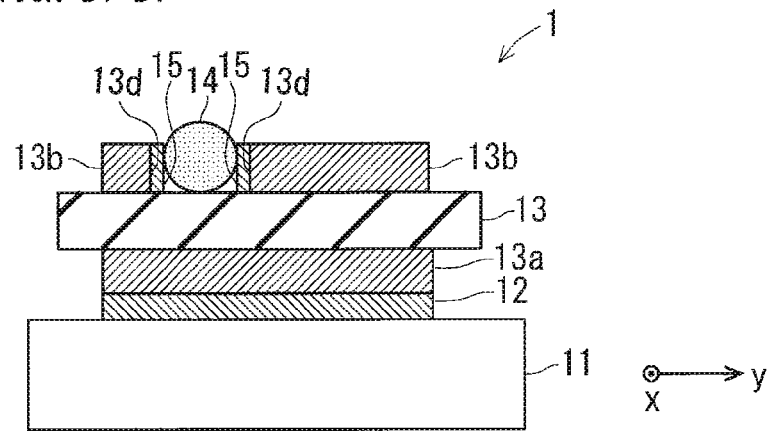
FIG. 3 is a cross-sectional view taken along a B1-B1 line showing the configuration of the semiconductor device according to the first preferred embodiment.

FIG. 1 is a top view showing a configuration of a semiconductor device according to a first preferred embodiment of the present invention, FIG. 2 is a cross-sectional view showing the configuration taken along an A1-A1 line of FIG. 1, and FIG. 3 is a cross-sectional view showing the configuration taken along a B1-B1 line of FIG. 1.

As shown in FIGS. 1 to 3, the semiconductor device according to the first preferred embodiment includes an electronic component mounting device 1, a power semiconductor element 31, and a solder 32. The electronic component mounting device 1 includes a base plate 11, a solder 12, an insulating substrate 13, a MELF electronic component 14, and conductive members 15.

A back surface metal pattern 13a bonded to the base plate 11 with the solder 12 is formed on a back surface (lower surface in FIGS. 2 and 3) of the insulating substrate 13. Meanwhile, metal patterns 13b are formed on a front surface (upper surface in FIGS. 2 and 3) of the insulating substrate 13. The power semiconductor element 31 is mounted on the insulating substrate 13 through the metal patterns 13b and the solder 32.

It will hereinafter be described that materials of the base plate 11 include Cu, but this is not restrictive. The materials may include another metal (for example, Al) as long as it can satisfy heat dissipation properties. It will be described that materials of the insulating substrate 13 include a ceramic such as MN, but this is not restrictive. The materials may include a ceramic, such as $Al_2O_3$, $Si_3N_4$, and BN as long as it can satisfy insulating properties and heat dissipation properties. It will be described that materials of the back surface metal pattern 13a and the metal patterns 13b include Cu, but this is not restrictive. The materials may include another metal (for example, Al) having conductivity and is bondable.

As shown in FIGS. 1 to 3, the metal patterns 13b and the insulating substrate 13 exposed from a lacking portion of the metal patterns 13b form a first receiving portion 13c. In the first preferred embodiment, the lacking portion of the metal patterns 13b extends from −y side end to +y side end of the metal patterns 13b, to thereby divide the metal patterns 13b into −x side and +x side. Then, the lacking portion of the metal patterns 13b extends from −x side end to +x side end of the metal patterns 13b, to thereby divide the metal patterns 13b into −y side and +y side. Thus, the metal patterns 13b are cut in a cross shape by the lacking portion to be divided into four in plan view. Consequently, side portions 13d facing each other of the divided metal patterns 13b and the insulating substrate 13 exposed from the lacking portion of the metal patterns 13b form the first receiving portion 13c.

The MELF electronic component 14 is, for example, a MELF resistor element or a MELF diode and has a cylindrical shape. A direction perpendicular to two circular surfaces of the MELF electronic component 14 will hereinafter be referred to as an "extending direction".

As shown in FIGS. 1 to 3, the MELF electronic component 14 in a state where its extending direction is aligned with the x direction is fitted into the first receiving portion 13c. Here, the first receiving portion 13c into which the MELF electronic component 14 is fitted is formed to have the width greater than the diameter of the MELF electronic component 14, so that more than a half of the MELF electronic component 14 is fitted into the first receiving portion 13c.

The conductive members 15 are, for example, a bonding member such as a solder and a silver paste, and the conductive members 15 are formed between the MELF electronic component 14 and the metal patterns 13b. In the first preferred embodiment, while a curved surface of the MELF electronic component 14 is in contact with the insulating substrate 13, the conductive members 15 bond the MELF electronic component 14 to each of the side portions 13d of the four metal patterns 13b. Thus, the four metal patterns 13b are electrically connected through the MELF electronic component 14.

Meanwhile, the conductive members 15 are not formed between the MELF electronic component 14 and the insulating substrate 13. The conductive members 15 can be formed in this manner by, for example, using a member having as high viscosity as possible for the conductive members 15 or forming a notch portion 13f which will be described in a fifth preferred embodiment.

In the semiconductor device (electronic component mounting device 1) according to the first preferred embodiment as described above, the MELF electronic component 14 is fitted into the first receiving portion 13c, whereby the positional displacement between the insulating substrate 13 and the MELF electronic component 14 can be suppressed. Moreover, the conductive members 15 are not formed between the MELF electronic component 14 and the insulating substrate 13, so that the flexibility between the MELF electronic component 14 and the insulating substrate 13 can be increased, whereby the thermal stress from the insulating substrate 13 to the MELF electronic component 14 can be easily absorbed by the conductive members 15. This can reduce the thermal stress applied to the MELF electronic component 14, and thus the semiconductor device (electronic component mounting device 1) with high reliability can be obtained.

It should be noted that the above-mentioned effects are effective, especially in a case where the power semiconductor element 31 having the relatively high heating value is mounted on the insulating substrate 13 as in the first preferred embodiment. The materials of the power semiconductor element 31 preferably include a wide band gap semiconductor (for example, SiC or GaN). In this manner, the device having excellent heat resistance can be obtained.

Second Preferred Embodiment

Figure 4:
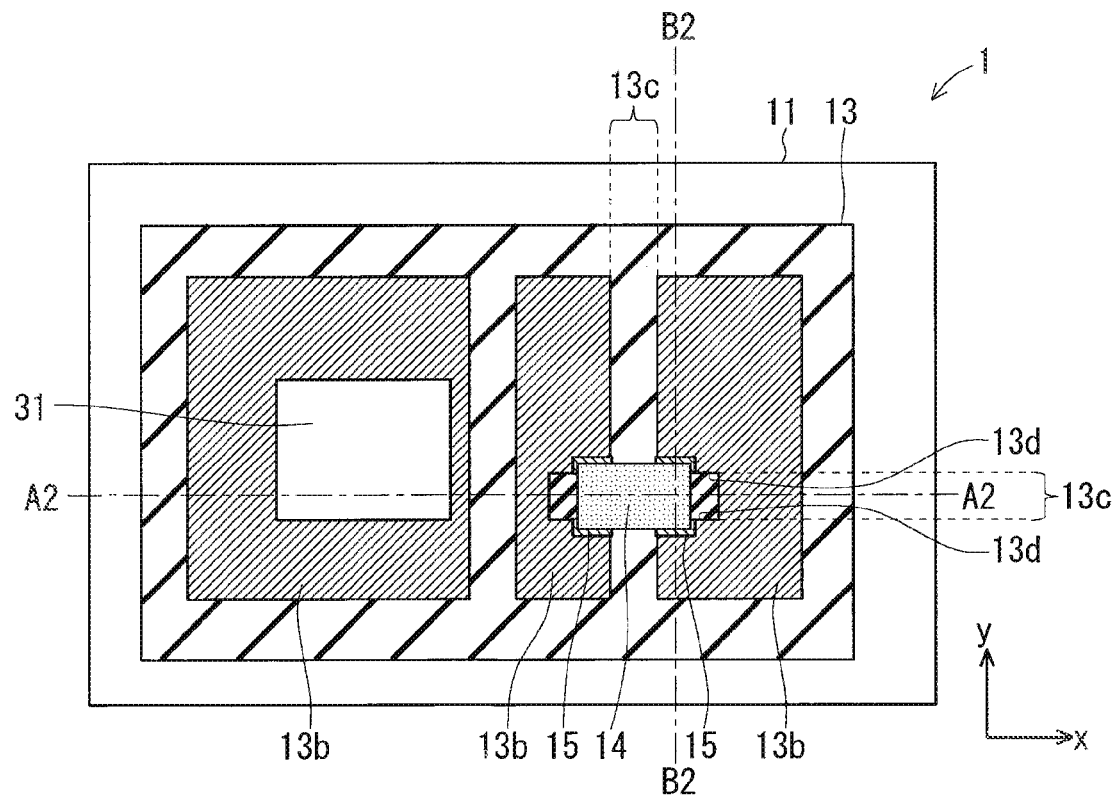
FIG. 4 is a top view showing a configuration of a semiconductor device according to a second preferred embodiment.
Figure 5:
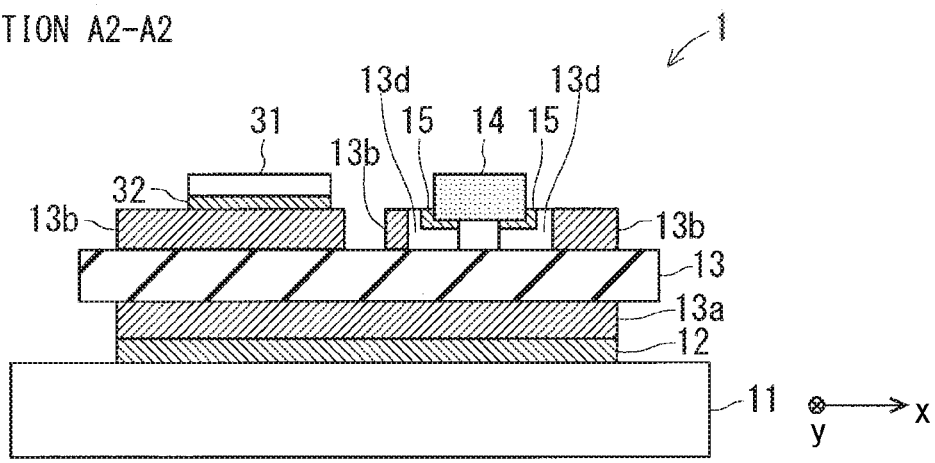
FIG. 5 is a cross-sectional view taken along an A2-A2 line showing the configuration of the semiconductor device according to the second preferred embodiment.
Figure 6:
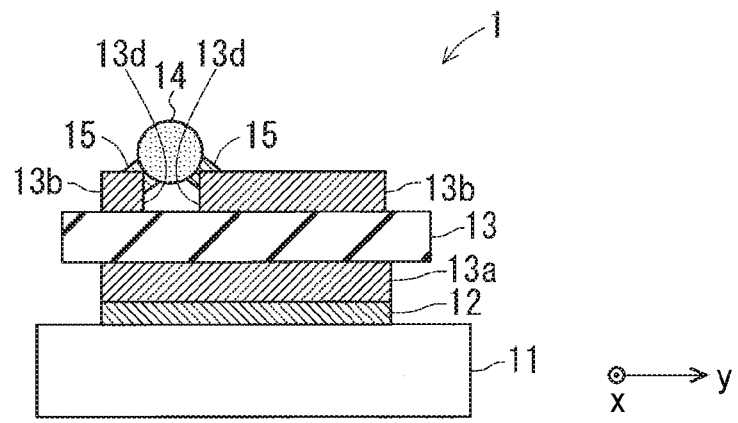
FIG. 6 is a cross-sectional view taken along a B2-B2 line showing the configuration of the semiconductor device according to the second preferred embodiment.

FIG. 4 is a top view showing a configuration of a semiconductor device according to a second preferred embodiment of the present invention, FIG. 5 is a cross-sectional view showing the configuration taken along an A2-A2 line of FIG. 4, and FIG. 6 is a cross-sectional view showing the configuration taken along a B2-B2 line of FIG. 4. In the semiconductor device according to the second preferred embodiment, the same or similar components as those described above are denoted by the same references while the differences are mainly described below.

As shown in FIGS. 4 to 6, in the second preferred embodiment similar to the first preferred embodiment, the metal patterns 13b and the insulating substrate 13 exposed from the lacking portion of the metal patterns 13b form the first receiving portion 13c. However, in the second preferred embodiment unlike the first preferred embodiment, the lacking portion of the metal patterns 13b extends from −y side end to +y side end of the metal patterns 13b, to thereby divide the metal patterns 13b into −x side and +x side. Then, the lacking portion of the metal patterns 13b extends part way from +x side end of the metal pattern 13b on −x side toward −x side while extending part way from −x side end of the metal pattern 13b on +x side toward +x side. Thus, the metal patterns 13b are cut in a cross shape by the lacking portion to be divided into two in plan view. Consequently, the side portions 13d facing each other of the divided metal patterns 13b and the insulating substrate 13 exposed from the lacking portion of the metal patterns 13*b* form the first receiving portion (metal notch portion) 13*c*.

The MELF electronic component 14 in a state where its extending direction is aligned with the x direction is fitted into the first receiving portion 13*c*. Here, the first receiving portion (metal notch portion) 13*c* into which the MELF electronic component 14 is fitted is formed to have the width smaller than the diameter of the MELF electronic component 14, so that the lower portion less than a half of the MELF electronic component 14 is fitted into the first receiving portion (metal notch portion) 13*c*.

In the second preferred embodiment similar to the first preferred embodiment, the conductive members 15 are not formed between the MELF electronic component 14 and the insulating substrate 13 but are formed between the MELF electronic component 14 and the metal patterns 13*b*. In the second preferred embodiment unlike the first preferred embodiment, while a gap is provided between the MELF electronic component 14 and the insulating substrate 13, the conductive members 15 bond the MELF electronic component 14 to each of the two side portions 13*d* and upper portions of the two metal patterns 13*b*. Thus, the two metal patterns 13*b* are electrically connected through the MELF electronic component 14.

In the semiconductor device (electronic component mounting device 1) according to the second preferred embodiment as described above, while the gap is provided between the MELF electronic component 14 and the insulating substrate 13, the conductive members 15 bond the MELF electronic component 14 to the side portions 13*d* and upper portions of the metal patterns 13*b*. This can increase flexibility between the MELF electronic component 14 and the insulating substrate 13, whereby the thermal stress applied to the MELF electronic component 14 can be reduced more. Therefore, the semiconductor device (electronic component mounting device 1) with higher reliability can be obtained.

Third Preferred Embodiment

Figure 7:
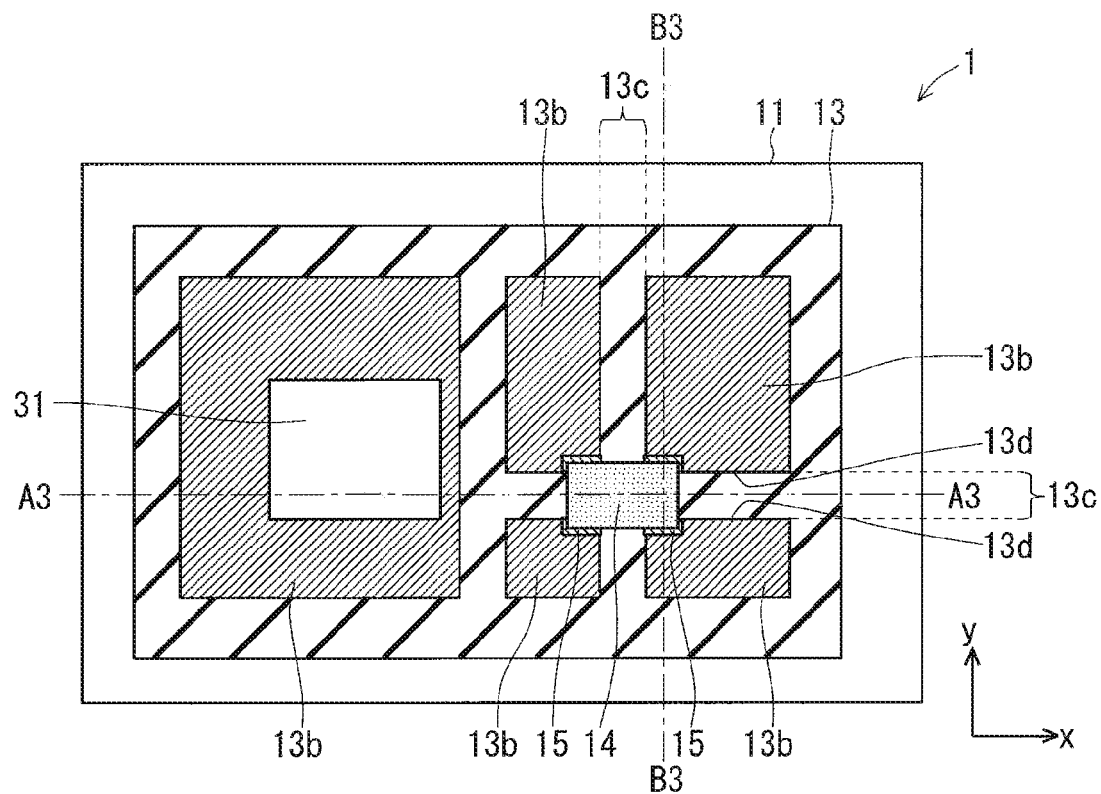
FIG. 7 is a top view showing a configuration of a semiconductor device according to a third preferred embodiment.
Figure 8:
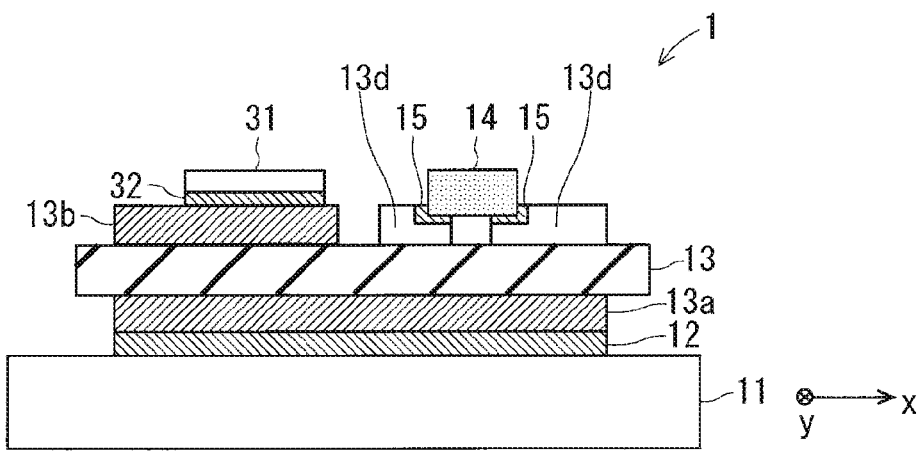
FIG. 8 is a cross-sectional view taken along an A3-A3 line showing the configuration of the semiconductor device according to the third preferred embodiment.
Figure 9:
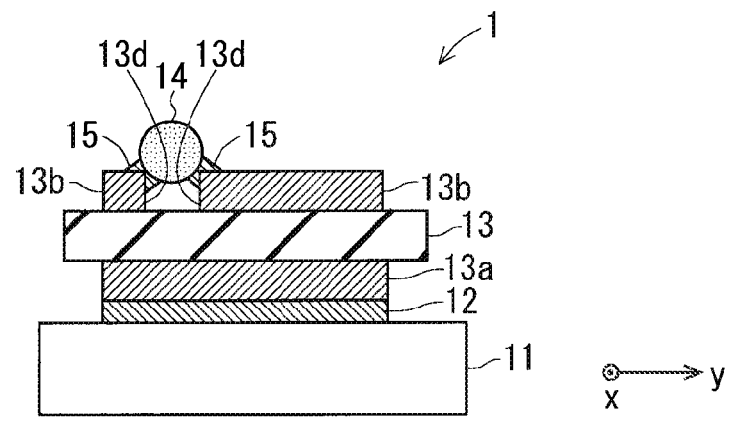
FIG. 9 is a cross-sectional view taken along a B3-B3 line showing the configuration of the semiconductor device according to the third preferred embodiment.

FIG. 7 is a top view showing a configuration of a semiconductor device according to a third preferred embodiment of the present invention, FIG. 8 is a cross-sectional view showing the configuration taken along an A3-A3 line of FIG. 7, and FIG. 9 is a cross-sectional view showing the configuration taken along a B3-B3 line of FIG. 7. In the semiconductor device according to the third preferred embodiment, the same or similar components as those described above are denoted by the same references while the differences are mainly described below.

As shown in FIGS. 7 to 9, in the third preferred embodiment similar to the first preferred embodiment, the metal patterns 13*b* and the insulating substrate 13 exposed from the lacking portion of the metal patterns 13*b* form the first receiving portion 13*c*. The side portions 13*d* facing each other of the metal patterns 13*b* cut in a cross shape by the lacking portion to be divided into four in plan view and the insulating substrate 13 exposed from the metal patterns 13*b* form the first receiving portion (slit) 13*c*.

The MELF electronic component 14 in a state where its extending direction is aligned with the x direction is fitted into the first receiving portion 13*c*. Here, the first receiving portion (slit) 13*c* into which the MELF electronic component 14 is fitted is formed to have the width smaller than the diameter of the MELF electronic component 14, so that the lower portion less than a half of the MELF electronic component 14 is fitted into the first receiving portion (slit) 13*c*.

In the third preferred embodiment similar to the second preferred embodiment, the conductive members 15 are not formed between the MELF electronic component 14 and the insulating substrate 13 but are formed between the MELF electronic component 14 and the metal patterns 13*b*. While the gap is provided between the MELF electronic component 14 and the insulating substrate 13, the conductive members 15 bond the MELF electronic component 14 to each of the side portions 13*d* and upper portions of the four metal patterns 13*b*. Thus, the four metal patterns 13*b* are electrically connected through the MELF electronic component 14.

In the semiconductor device (electronic component mounting device 1) according to the third preferred embodiment as described above, while the gap is provided between the MELF electronic component 14 and the insulating substrate 13, the conductive members 15 bond the MELF electronic component 14 to the side portions 13*d* and upper portions of the metal patterns 13*b*. Thus, similarly to the second preferred embodiment, the thermal stress applied to the MELF electronic component 14 can be reduced more, whereby the semiconductor device (electronic component mounting device 1) with higher reliability can be obtained. Moreover, the first receiving portion (slit) 13*c* according to the third preferred embodiment can be formed more easily than the first receiving portion (metal notch portion) 13*c* according to the second preferred embodiment, so that the semiconductor device (electronic component mounting device 1) can be easily formed.

Fourth Preferred Embodiment

Figure 10:
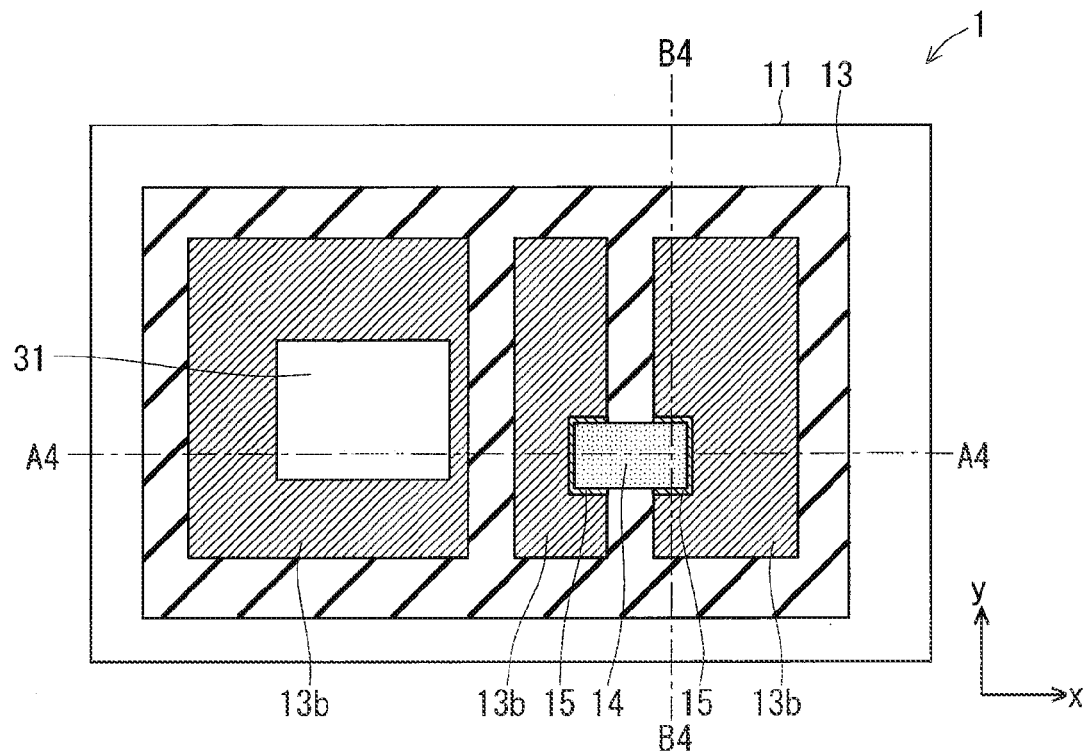
FIG. 10 is a top view showing a configuration of a semiconductor device according to a fourth preferred embodiment.
Figure 11:
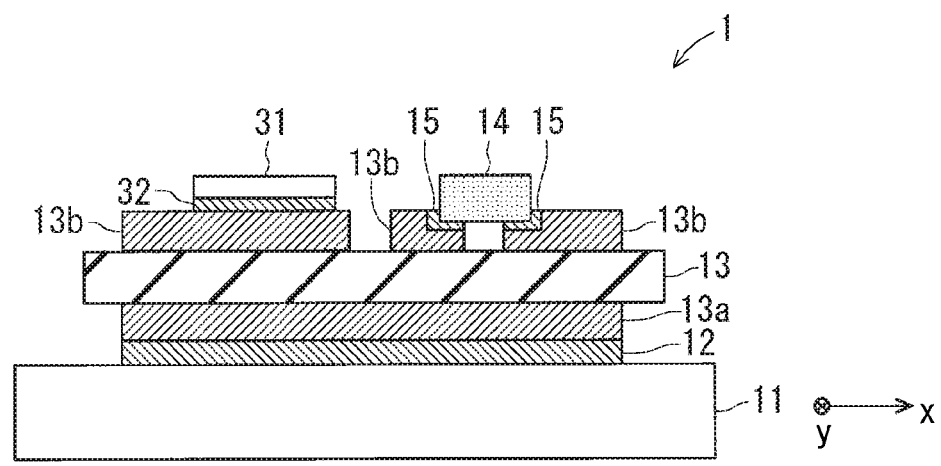
FIG. 11 is a cross-sectional view taken along an A4-A4 line showing the configuration of the semiconductor device according to the fourth preferred embodiment.
Figure 12:
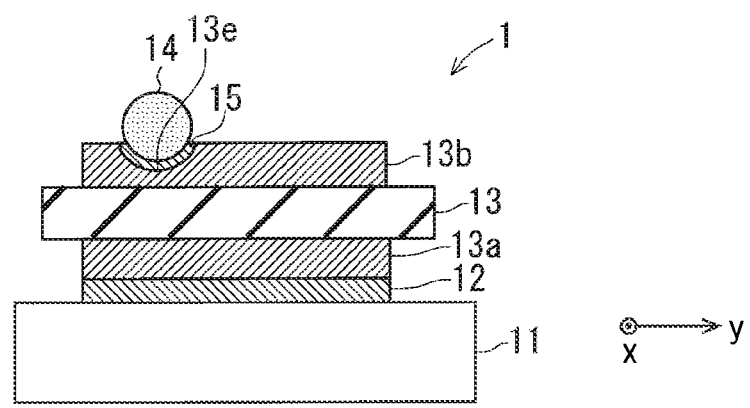
FIG. 12 is a cross-sectional view taken along a B4-B4 line showing the configuration of the semiconductor device according to the fourth preferred embodiment.

FIG. 10 is a top view showing a configuration of a semiconductor device according to a fourth preferred embodiment of the present invention, FIG. 11 is a cross-sectional view showing the configuration taken along an A4-A4 line of FIG. 10, and FIG. 12 is a cross-sectional view showing the configuration taken along a B4-B4 line of FIG. 10. In the semiconductor device according to the fourth preferred embodiment, the same or similar components as those described above are denoted by the same references while the differences are mainly described below.

In the fourth preferred embodiment, the metal patterns 13*b* are divided into two by the lacking portion of the metal pattern 13*b*. As shown in FIG. 12, recessions (step portions) are each formed in an upper portion of the side portion 13*d* of the one metal pattern 13*b* facing the other metal pattern 13*b* and in an upper portion of the side portion 13*d* of the other metal pattern 13*b* facing the one metal pattern 13*b*, and a second receiving portion 13*e* is configured with the recessions. The recessions of the second receiving portion 13*e* are formed to have the same or similar shape as the curved surface shape of the MELF electronic component 14, for example.

In the fourth preferred embodiment similar to the first preferred embodiment, the conductive members 15 are not formed between the MELF electronic component 14 and the insulating substrate 13 but are formed between the MELF electronic component 14 and the metal patterns 13*b*. In the fourth preferred embodiment unlike the first preferred embodiment, while the gap is provided between the MELF electronic component 14 and the insulating substrate 13, the conductive members 15 bond the MELF electronic component 14 to each of the insides of the recessions of the two metal patterns 13b. Thus, the two metal patterns 13b are electrically connected through the MELF electronic component 14.

In the semiconductor device (electronic component mounting device 1) according to the fourth preferred embodiment as described above, the effects similar to those in the first preferred embodiment can be obtained. The position of the MELF electronic component 14 can coincide with a design portion more easily by fitting the MELF electronic component 14 into the second receiving portion 13e than by fitting the MELF electronic component 14 into the first receiving portion 13c described in the first to the third preferred embodiments. Therefore, the fourth preferred embodiment can increase the accuracy of the position where the MELF electronic component 14 is mounted.

Fifth Preferred Embodiment

Figure 13:
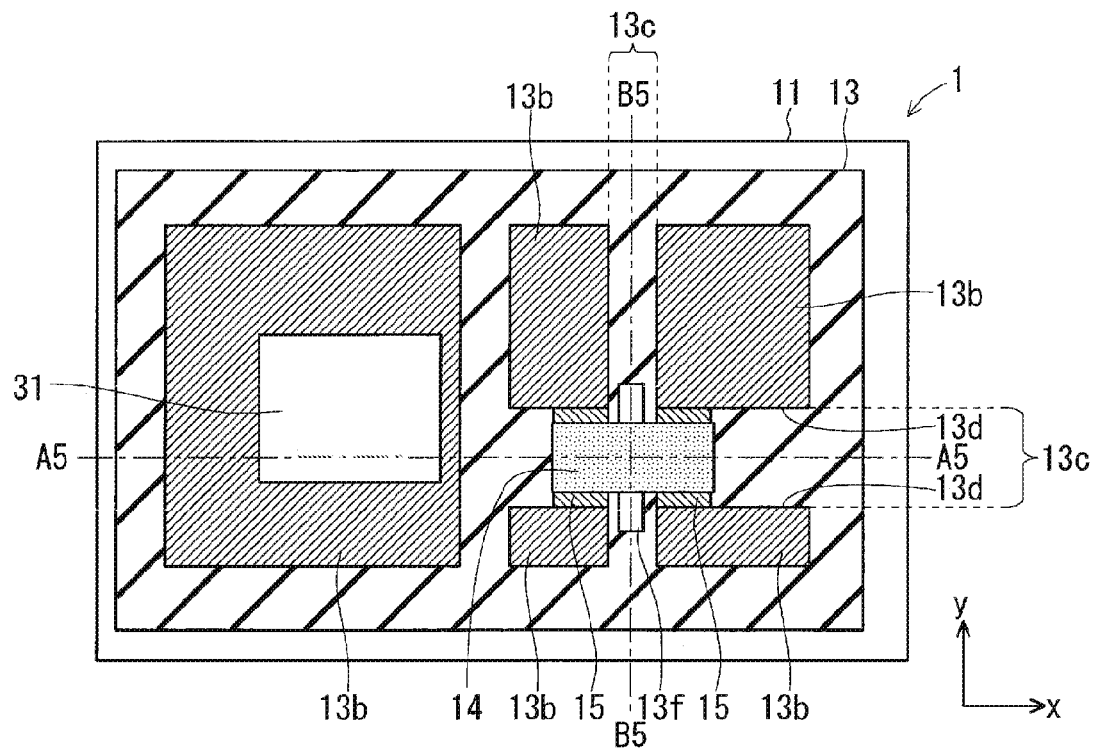
FIG. 13 is a top view showing a configuration of a semiconductor device according to a fifth preferred embodiment.
Figure 14:
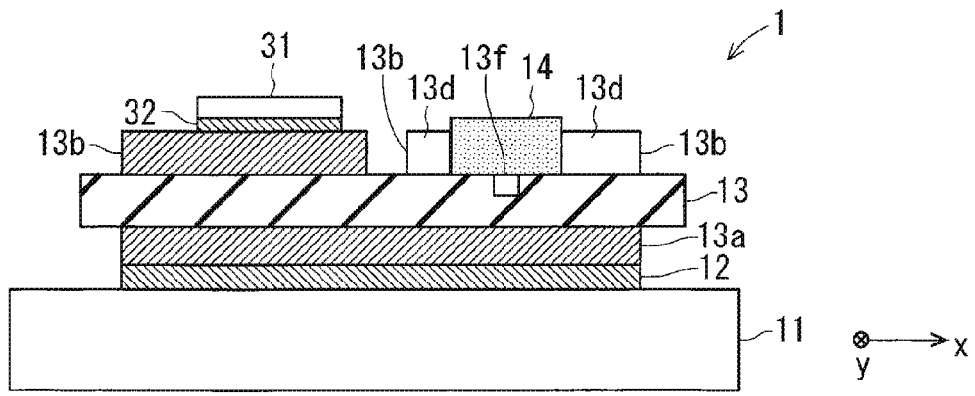
FIG. 14 is a cross-sectional view taken along an A5-A5 line showing the configuration of the semiconductor device according to the fifth preferred embodiment.
Figure 15:
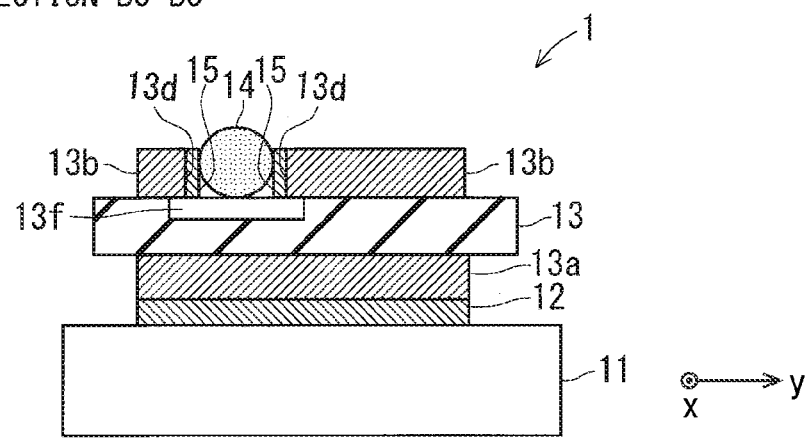
FIG. 15 is a cross-sectional view taken along a B5-B5 line showing the configuration of the semiconductor device according to the fifth preferred embodiment.

FIG. 13 is a top view showing a configuration of a semiconductor device according to a fifth preferred embodiment of the present invention, FIG. 14 is a cross-sectional view showing the configuration taken along an A5-A5 line of FIG. 13, and FIG. 15 is a cross-sectional view showing the configuration taken along a B5-B5 line of FIG. 13. In the semiconductor device according to the fifth preferred embodiment, the same or similar components as those described above are denoted by the same references while the differences are mainly described below.

As shown in FIGS. 13 to 15, in the fifth preferred embodiment, a notch portion 13f is formed on a surface of the insulating substrate 13 located between the plurality of conductive members 15. Here, the notch portion 13f is formed to separate the plurality of conductive members 15.

In the semiconductor device (electronic component mounting device 1) according to the fifth preferred embodiment as described above, the effects similar to those in the first preferred embodiment can be obtained. For example, in a case where the conductive members 15 are a solder, the notch portion 13f can suppress a solder ball or a solder bridge. Therefore, yields can be improved. With the notch portion 13f formed in the insulating substrate 13, the amount of necessary materials used for the insulating substrate 13 can be reduced, and thus cost-reduction can be expected.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. An electronic component mounting device, comprising:
   an insulating substrate having a metal pattern formed thereon; and
   a metal electrode leadless face (MELF) electronic component, wherein
   said MELF electronic component is fitted into a receiving portion configured with said metal pattern and said insulating substrate exposed from a lacking portion of said metal pattern,
   said electronic component mounting device further includes a conductive member formed between said MELF electronic component and said metal pattern,
said conductive member is not formed between said MELF electronic component and said insulating substrate,
said metal pattern does not extend into said receiving portions,
a notch portion is formed on a surface of said insulating substrate, the surface being located between a plurality of said conductive members, and
said notch portion in a predetermined horizontal direction is shorter than said MELF electronic component in the predetermined horizontal direction.

2. The electronic component mounting device according to claim 1, wherein
   said first receiving portion is formed by said side portions facing each other of said metal pattern cut in a cross shape to be divided into four in plan view and said insulating substrate exposed from said lacking portion of said metal pattern, and
   in a state where said MELF electronic component is in contact with said insulating substrate, said conductive member bonds said MELF electronic component to said side portions of said metal pattern.

3. The electronic component mounting device according to claim 1, wherein in a state where a gap is provided between said MELF electronic component and said insulating substrate, said MELF electronic component and said metal pattern are bonded.

4. The electronic component mounting device according to claim 3, wherein
   said first receiving portion is formed by side portions facing each other of said metal pattern cut in a cross shape to be divided into two in plan view and said insulating substrate exposed from said lacking portion of said metal pattern, and
   said conductive member bonds said MELF electronic component to said side portions of said metal pattern and upper portions thereof.

5. The electronic component mounting device according to claim 3, wherein
   said first receiving portion is formed by side portions facing each other of said metal pattern cut in a cross shape to be divided into four in plan view and said insulating substrate exposed from said lacking portion of said metal pattern, and
   said conductive member bonds said MELF electronic component to said side portions of said metal pattern and upper portions thereof.

6. The electronic component mounting device according to claim 1, wherein said conductive member bonds said MELF electronic component to the insides of said recessions of said second receiving portion of said metal pattern.

7. A semiconductor device, comprising:
   the electronic component mounting device according to claim 1; and
   a power semiconductor element, wherein
   said power semiconductor element is mounted on said insulating substrate.

8. The semiconductor device according to claim 7, wherein a material of said power semiconductor element includes a wide band gap semiconductor.

9. The electronic component mounting device according to claim 1, wherein said conductive member is a solder or conductive paste.

10. The semiconductor device according to claim 7, wherein said conductive member is a solder or conductive paste.

11. An electronic component mounting device, comprising:
- an insulating substrate having a metal pattern formed thereon; and
- a metal electrode leadless face (MELF) electronic component, wherein
- said MELF electronic component is fitted into fitted into a receiving portion configured with recessions formed in upper portions of side portions facing each other of said metal pattern divided by a lacking portion of said metal pattern,
- said electronic component mounting device further includes a conductive member formed between said MELF electronic component and said metal pattern,
- said conductive member is not formed between said MELF electronic component and said insulating substrate,
- the thickness of said metal pattern becomes smaller in said receiving portions,
- a notch portion is formed on a surface of said insulating substrate, the surface being located between a plurality of said conductive members, and
- said notch portion in a predetermined horizontal direction is shorter than said MELF electronic component in the predetermined horizontal direction.

12. A semiconductor device, comprising:
- the electronic component mounting device according to claim 11; and
- a power semiconductor element, wherein
- said power semiconductor element is mounted on said insulating substrate.

* * * * *